US008973526B2

United States Patent
Lee et al.

(10) Patent No.: US 8,973,526 B2
(45) Date of Patent: Mar. 10, 2015

(54) PLASMA DEPOSITION APPARATUS AND METHOD

(75) Inventors: Wook Seong Lee, Seoul (KR); Young Joon BaiK, Seoul (KR); Jong-Keuk Park, Seoul (KR); Gyu Weon Hwang, Seoul (KR); Jeung-hyun Jeong, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 1793 days.

(21) Appl. No.: 11/953,348

(22) Filed: Dec. 10, 2007

(65) Prior Publication Data

US 2009/0127102 A1 May 21, 2009

(30) Foreign Application Priority Data

Nov. 15, 2007 (KR) .......................... 10-2007-0116932

(51) Int. Cl.
*C23C 14/34* (2006.01)
*C23C 16/00* (2006.01)
*H01J 37/34* (2006.01)

(52) U.S. Cl.
CPC ......... *H01J 37/3497* (2013.01); *H01J 37/3435* (2013.01)
USPC ........ 118/723 E; 118/724; 118/725; 118/728; 118/729; 118/720; 204/298.09; 204/298.11; 204/298.15; 204/298.41

(58) Field of Classification Search
CPC .............. H01J 37/3497; H01J 37/3435; H01J 37/32532; H01J 37/32715; H01J 37/32724
USPC ............. 204/298.09, 298.11, 298.15, 298.41; 118/723 E, 724, 725, 728, 729, 720
See application file for complete search history.

(56) References Cited

U.S. PATENT DOCUMENTS

| | | | | |
|---|---|---|---|---|
| 3,730,867 A | * | 5/1973 | Albers, Jr. et al. | 204/192.15 |
| 4,392,939 A | * | 7/1983 | Crombeen et al. | 204/298.19 |
| 4,747,928 A | * | 5/1988 | Takahashi et al. | 204/298.09 |
| 4,816,133 A | * | 3/1989 | Barnett | 204/298.06 |
| 4,906,011 A | * | 3/1990 | Hiyamizu et al. | 279/3 |
| 5,534,073 A | * | 7/1996 | Kinoshita et al. | 118/728 |
| 5,888,304 A | * | 3/1999 | Umotoy et al. | 118/720 |
| 6,399,151 B2 | * | 6/2002 | Lee et al. | 427/249.8 |
| 2003/0106793 A1 | * | 6/2003 | Sirkis et al. | 204/297.01 |

FOREIGN PATENT DOCUMENTS

| | | | |
|---|---|---|---|
| JP | 05-293733 | * | 9/1993 |
| JP | 2004-009165 | * | 1/2004 |
| KR | 2007-53361 | | 5/2007 |

OTHER PUBLICATIONS

Machine Translation JP 05-293733 dated Sep. 1993.*

* cited by examiner

*Primary Examiner* — Rodney McDonald
(74) *Attorney, Agent, or Firm* — Ladas & Parry LLP

(57) ABSTRACT

A plasma deposition apparatus includes a cathode assembly including a cathode disk and a water-coolable cathode holder supporting the cathode disk, an anode assembly including a water-coolable anode holder, a substrate mounted on the anode holder to serve as an anode, and a substrate holder mounting and supporting the substrate, and a reactor for applying a potential difference between opposing surfaces of the cathode assembly and the anode assembly under a vacuum state to form plasma of a raw gas. The cathode disk comes into thermal contact with the cathode holder using at least one of a self weight and a vacuum absorption force so as to permit thermal expansion of the cathode disk.

20 Claims, 12 Drawing Sheets

PLASMA DEPOSITION APPARATUS AND METHOD

FIELD OF THE INVENTION

The present invention relates to a plasma deposition apparatus and a plasma deposition method, and in particular, to a plasma deposition apparatus and a plasma deposition method that deposits a material, such as diamond, on a substrate.

BACKGROUND OF THE INVENTION

A known microcrystalline diamond (hereinafter, referred to as "MCD") thin film synthesis apparatus is used to synthesize a nanocrystalline diamond (hereinafter, referred to as "NCD") thin film. In this case, however, the synthesis parameters for the NCD thin file are employed to be distinct from the synthesis parameters for the MCD thin film. Due to the distinct synthesis parameters employed, stability and uniformity may be markedly deteriorated. Accordingly, the known synthesis apparatus and process need to be considerably changed.

A microwave plasma CVD method or a hot filament CVD method is hitherto representatively used to deposit the MCD thin film and the NCD thin film. The microwave plasma CVD method has problems in that it is hard to form a large-area thin film and to handle a microwave. In the hot filament method, a simple thermal decomposition method is used. Accordingly, the hot filament method is economic in view of ease of forming a large-area thin film and a simple structure. However, since a filament is used, inconvenience may be caused, and impurities may be introduced. In addition, the thermal decomposition method has problems against the plasma method. Therefore, there is a need for a new synthesis method to overcome the drawbacks inherent in the related art.

SUMMARY OF THE INVENTION

The invention has been finalized in order to overcome the drawbacks inherent in the above-described plasma method, and it is an object of the present invention to provide a plasma deposition apparatus that deposits a material, such as diamond, on a substrate, such as a semiconductor substrate.

It is another object of the present invention to provide a plasma deposition method that deposits a material, such as diamond, on a substrate, such as a semiconductor substrate.

According to a first aspect of the present invention, a plasma deposition apparatus includes: a cathode assembly including a cathode disk and a water-coolable cathode holder supporting the cathode disk; an anode assembly including a water-coolable anode holder, a substrate mounted on the anode holder to serve as an anode, and a substrate holder mounting and supporting the substrate; and a reactor for applying a potential difference between opposing surfaces of the cathode assembly and the anode assembly under a vacuum state to form plasma of a raw gas. The cathode disk comes into thermal contact with the cathode holder using at least one of a self weight and a vacuum absorption force so as to permit thermal expansion of the cathode disk.

According to a second aspect of the present invention, there is provided a plasma deposition method using a plasma deposition apparatus, the plasma deposition apparatus including an anode assembly, which includes a substrate holder having an externally operable shutter mounted thereon, a substrate being mounted in an inner space below the shutter, a cathode assembly, and a reactor. The plasma deposition method includes the steps of: closing the shutter to separate the substrate from plasma so as to prevent electric charges from being accumulated on the substrate, and heating-up the substrate holder by the plasma and an anode glow, such that the substrate is indirectly heated; and if the substrate restores conductivity after the heating-up is completed, opening the shutter to gradually expose the substrate to the anode glow and start to deposit a thin film.

According to a third aspect of the present invention, a plasma deposition apparatus includes a cathode assembly, an anode assembly, and a reactor. The anode assembly includes a substrate holder that has an externally operable shutter mounted thereon, a substrate being mounted in an inner space below the shutter, a support that separably supports the substrate holder by a self weight and is electrically grounded, and an anode holder that moves up and down independently from the support and comes into thermal contact with the substrate holder when moving up.

According to a fourth aspect of the present invention, there is provided a plasma deposition method using a plasma deposition apparatus, the plasma deposition apparatus including an anode assembly, a cathode assembly, and a reactor, and the anode assembly including a substrate holder having an externally operable shutter mounted thereon, a substrate being mounted in an inner space below the shutter, a support separably supporting the substrate holder by a self weight and being electrically grounded, and an anode holder moving up and down independently from the support and coming into thermal contact with the substrate holder when moving up. The plasma deposition method includes the steps of: in a state where the anode holder moves down to be separated from the substrate holder and the shutter is closed, performing a heating-up including igniting plasma and then gradually increasing a discharge current, a discharge voltage, and a gas pressure; and if the substrate restores conductivity after the heating-up, opening the shutter to gradually expose the substrate to an anode glow and start to deposit a thin film, and moving up the anode holder to bring the anode holder into thermal contact with the substrate holder, which is separated from the support.

According to the aspects of the present invention, a crack can be prevented from occurring in the surface of the cathode formed of a high melting point metal when a material, such as diamond, is deposited by a DC (discharge) plasma deposition process.

In addition, when a semiconductor substrate, such as silicon, is used, the semiconductor substrate can be prevented from being damaged, thereby depositing a uniform and undamaged thin film.

DETAILED DESCRIPTION OF THE EMBODIMENTS

Hereinafter, exemplary embodiments of the present invention will be described in detail with reference to the accompanying drawings. In the embodiments of the present invention, detailed description of known structures and functions incorporated herein will be omitted when it may make the subject matter of the present invention unclear.

As a synthesis and deposition method of an MCD thin film and an NCD thin film, a direct-current (DC) plasma deposition apparatus may be used.

Figure 1:
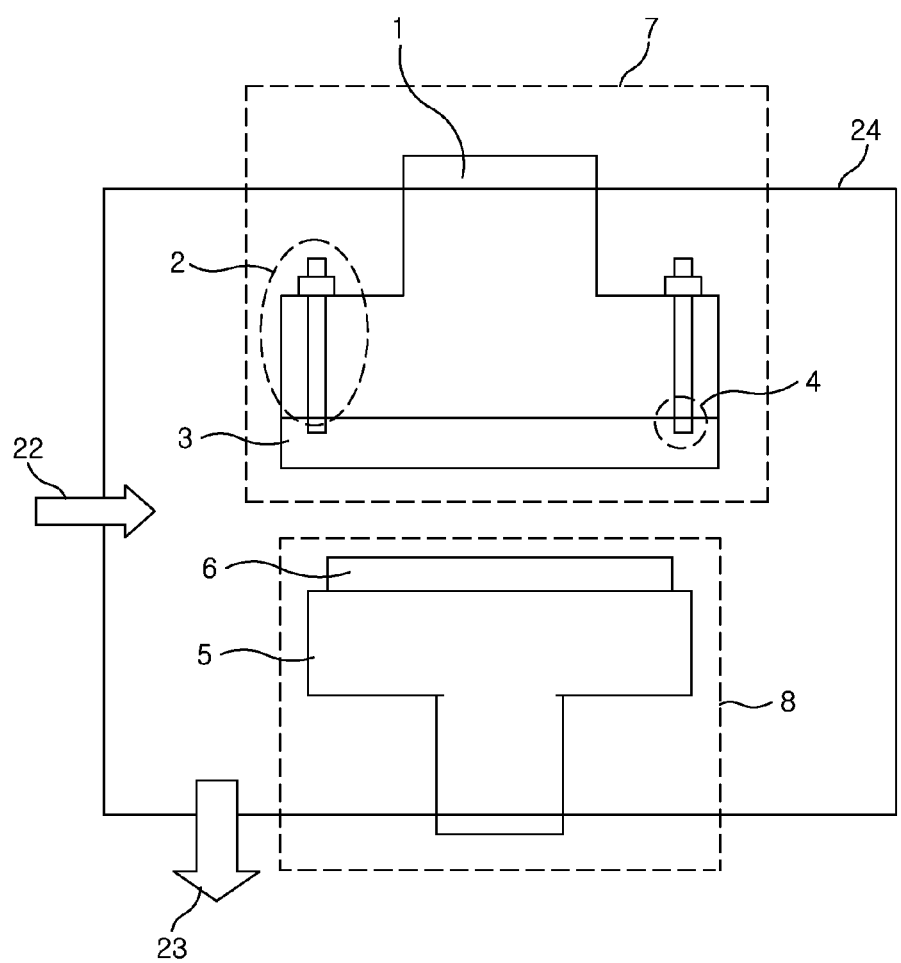
FIG. 1 is a diagram showing the configuration of a DC plasma deposition apparatus that is used to deposit an MCD thin film and an NCD thin film.

FIG. 1 is a diagram showing the configuration of a DC plasma deposition apparatus that is used to deposit an MCD thin film and an NCD thin film.

A disk formed of a high melting point metal, such as tungsten, is used as a cathode disk 3 that comes into contact with plasma. The cathode disk 3 is coupled to a cathode holder 1 using bolts and nuts 2 via internal screw holes 4 in the cathode disk 3. The cathode holder 1 is formed of a material having a good heat transfer characteristic, such as copper, and is cooled by cooling water. In FIG. 1, reference number 5 denotes an anode holder, reference numeral 6 denotes a substrate, reference numeral 7 denotes a cathode assembly, reference numeral 8 denotes an anode assembly, reference numeral 22 denotes an inlet port, reference 23 denotes an outlet port, and reference numeral 24 denotes a reactor.

Meanwhile, if the cathode disk 3 formed of a material having high brittleness is fixed in the above-described manner, when the cathode disk 3 is used for a long time, a minute crack may occur in the surface of the cathode disk 3, and solid carbon may be formed in the crack. The solid carbon may keep remain without being completely removed during a cleaning process after deposition. The residual solid carbon may cause an arc, and thus the substrate, the deposited film, and the anode surface may be damaged.

The reason why the crack occurs in the surface of the cathode disk 3 will now be described in detail.

When the cathode disk 3 is at room temperature, a deposition process starts. A voltage is applied between the cathode disk 3 and the substrate 6, and a reactive gas is introduced into an inter-electrode space via the inlet port 22. Then, an appropriate vacuum state of 1 Torr or less is kept by vacuum pumping (not shown), and plasma is ignited. During a heat-up process, after the plasma is ignited, a discharge current, a discharge voltage, and a gas pressure within the reactor start to be gradually increased. If the plasma starts to emit light in the inter-electrode space (i.e., a space between the cathode disk 3 and the substrate 6 in FIG. 1), and the discharge current and the discharge voltage increase to tens amperes and about 500 volts, respectively, the temperature of the cathode increases to about 800° C. At this time, the cathode disk 3 undergoes thermal expansion in a radial direction and a thickness direction. However, since the cathode disk 3 is mechanically fixed to the cathode holder 1 by the bolts and nuts 2, the thermal expansion is suppressed, and thermal stress is generated. Specifically, only a surface of the cathode disk 3 that is in contact with the cathode holder 1 is fixed to the holder by the bolts and nuts 2, and an opposite surface (a surface facing the plasma) is not fixed. Accordingly, a bending moment occurs during the thermal expansion. That is, compressive stress occurs in the upper surface of the cathode disk 3, and tensile stress occurs in the lower surface of the cathode disk 3. If this phenomenon is repeatedly generated over several months, there occurs a crack in the surface of the cathode. This crack markedly appears when the cathode is formed of a material having high hardness but fragility, such as tungsten.

In summary, when the cathode is used for a long time, a crack occurs in the cathode disk 3, and solid carbon is formed in the crack. The solid carbon in the crack is rarely cleaned and causes an electrical arc each time the process is performed, and as a result, the substrate and the thin film may be damaged. That is, if the cathode disk 3 is formed of tungsten, since tungsten has high melting point and hardness, it is inactive to hydrogen and nitrogen, while since it has low toughness, a crack may easily occur.

In addition, the high melting point metal, such as, tungsten, for the cathode disk 3 is hard to be mechanically processed and has high brittleness. Accordingly, when each of the internal screw holes 4 is formed, a minute crack may easily occur around the hole. The crack may gradually grow if the deposition process is repeatedly performed and then the thermal stress is repeatedly applied, and as a result, it may spread over the cathode disk 3. This phenomenon may be accelerated if the surface of the cathode disk 3 is carbonized during the deposition process and has higher brittleness.

Therefore, there is a need for a new technology that can overcome the above problems.

In the present invention, when the cathode disk is mounted on the cathode holder, amounting structure that does not suppress but freely allows the thermal expansion of the cathode disk is used to overcome the drawbacks in the above-described DC plasma deposition apparatus. According to the present invention, a cathode disk mounting structure that does not limit the thermal expansion of the cathode in the radial direction and the thickness direction is used, thereby preventing a crack from occurring in the cathode disk.

Embodiments

Figure 2:
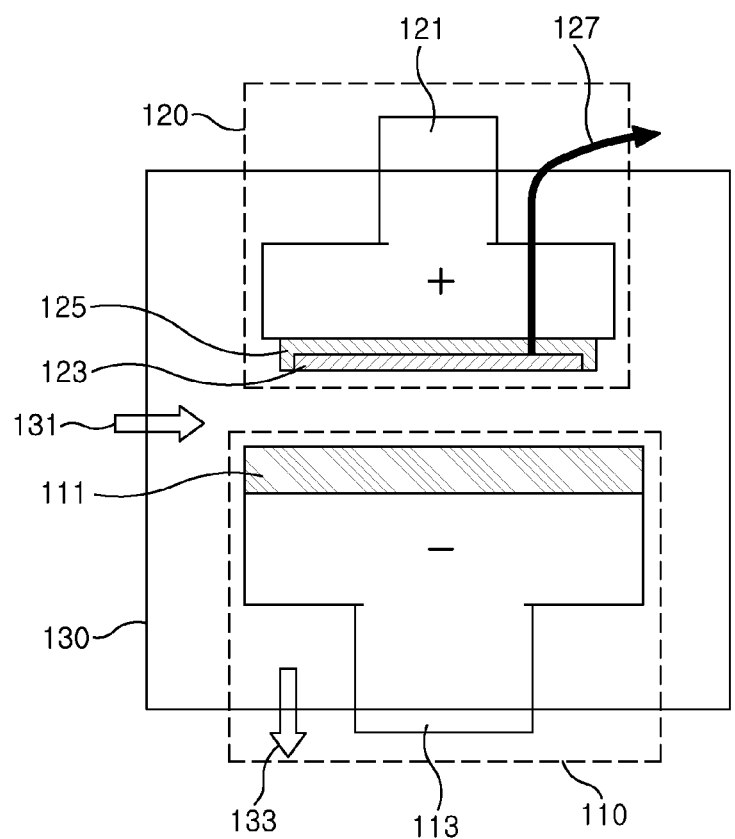
FIG. 2 is a diagram showing the configuration of a DC plasma deposition apparatus according to a first embodiment of the present invention.

FIG. 2 is a diagram showing the configuration of a DC plasma deposition apparatus according to a first embodiment of the present invention.

Referring to FIG. 2, the DC plasma deposition apparatus according to the first embodiment of the present invention includes a cathode assembly 110 and an anode assembly 120 that are provided to face each other, and a reactor 130 that applies a potential difference between opposing surfaces of the cathode assembly 110 and the anode assembly 120 under a vacuum state to form plasma of a raw gas.

The cathode assembly 110 includes a cathode disk 111, and a water-coolable cathode holder 113 that supports the cathode disk 111. The cathode assembly 110 is mounted at a lower portion of the reactor 130.

The anode assembly 120 is mounted at an upper portion of the reactor 130. The anode assembly 120 includes a water-coolable anode holder 121, a substrate 123 that is mounted on the anode holder 121 to serve as an anode, a substrate holder 125 that mounts and supports the substrate 123, and a vacuum suction line 127 that passes through the anode holder 121 and the substrate holder 125, and forms a vacuum absorption force at a contact surface of the substrate holder 125 and the substrate 123, and a contact surface of the anode holder 121 and the substrate holder 125. In FIG. 2, reference numeral 131 denotes an inlet port of the reactor 130, and reference numeral 133 denotes an outlet port of the reactor 130.

According to the first embodiment of the present invention, since the cathode assembly 110 is mounted at the lower portion of the reactor 130, and the anode assembly 120 is mounted at the upper portion of the reactor 130, the cathode disk 111 comes into thermal contact with the cathode holder 113 by its self weight, without needing an additional mechanism that fixes the cathode disk 111.

Therefore, it is not necessary to form screw holes for fixing the cathode disk 111, and thus a minute crack does not occur. In addition, since the thermal expansion is not suppressed, compared with a case where the cathode disk is fixed by the bolts and nuts, thermal stress is not generated, and thus no crack occurs.

Particularly, when a disk formed of a high melting point metal, such as tungsten, is used as the cathode disk 111 that is in contact with the plasma, since tungsten has high specific gravity, the cathode disk 111 sufficiently comes into thermal contact with the cathode holder 113 by its self weight and is then sufficiently cooled.

Figure 3:
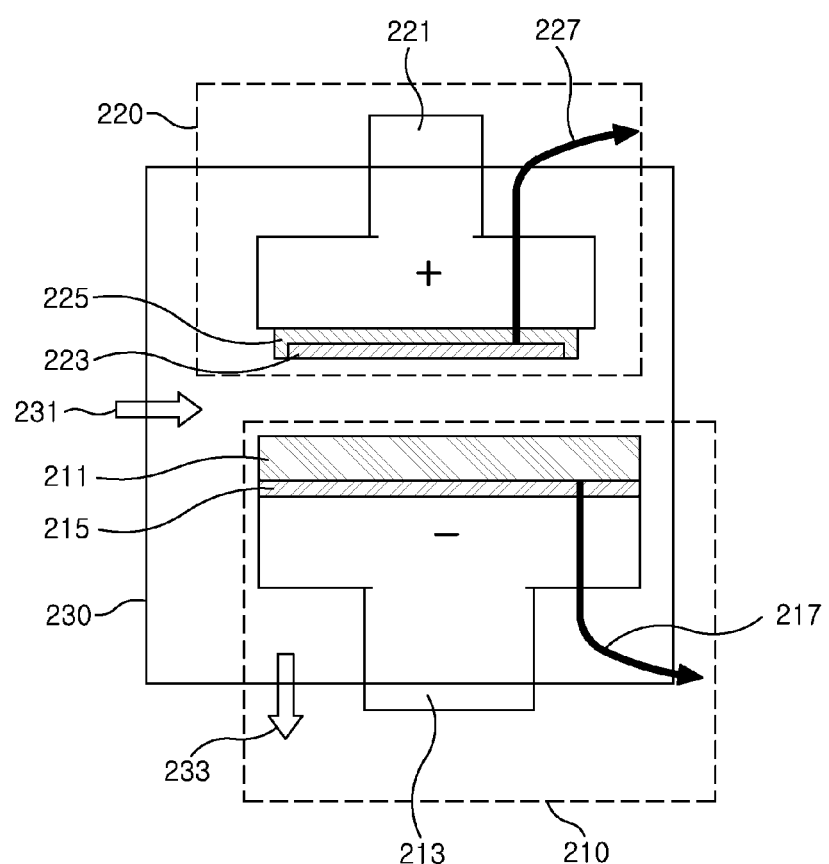
FIG. 3 is a diagram showing the configuration of a DC plasma deposition apparatus according to a second embodiment of the present invention.

FIG. 3 is a diagram showing the configuration of a DC plasma deposition apparatus according to a second embodiment of the present invention.

Referring to FIG. 3, the DC plasma deposition apparatus according to the second embodiment of the present invention includes a cathode assembly 210 and an anode assembly 220 that are provided to face each other, and a reactor 230 that applies a potential difference between opposing surfaces of the cathode assembly 210 and the anode assembly 220 under a vacuum state to form plasma of a raw gas.

The cathode assembly 210 is mounted at the lower portion of the reactor 230. The cathode assembly 210 includes a cathode disk 211, a water-coolable cathode holder 213 that supports the cathode disk 211, a thin antifriction plate 215 that is formed of graphite to reduce a frictional force at a contact surface of the cathode disk 211 and the cathode holder 213 during thermal expansion of the cathode disk 211, and a vacuum suction line 217 that is formed to pass through the cathode holder 213 and the antifriction plate 215, and forms a vacuum absorption force at a contact surface of the cathode disk 211 and the antifriction plate 215, and a contact surface of the antifriction plate 215 and the cathode holder 213.

The anode assembly 220 is mounted at the upper portion of the reactor 230. The anode assembly 220 includes a water-coolable anode holder 221, a substrate 223 that is mounted on the anode holder 221 to serve as an anode, a substrate holder 225 that mounts and supports the substrate 223, and a vacuum suction line 227 that passes through the anode holder 221 and the substrate holder 225, and forms a vacuum absorption force at a contact surface of the substrate holder 225 and the substrate 223, and a contact surface of the anode holder 221 and the substrate holder 225. In FIG. 3, reference numeral 231 denotes an inlet port of the reactor 230, and reference numeral 233 denotes an outlet port of the reactor 230.

According to the second embodiment of the present invention, similarly to the first embodiment, since the cathode assembly 210 is mounted at the lower portion of the reactor 230, and the anode assembly 220 is mounted at the upper portion of the reactor 230, the cathode disk 211 comes into thermal contact with the cathode holder 213 by its self weight. In addition, to improve thermal contact between the cathode disk 211 and the cathode holder 213, a vacuum chuck method using the vacuum suction line 217 is employed to support the cathode disk 211 on the cathode holder 213 by an absorption force, such that a degree of thermal contact can be controlled. During the deposition process, the pressure of the reactive gas within the reactor 230 is maintained at about 100 to 400 Torr. Due to a difference between the vacuum and the pressure of the reactive gas within the reactor 230, a sufficient vacuum absorption force is obtained.

In addition, the degree of vacuum within the vacuum suction line 217 is controlled to adjust the vacuum absorption force between the cathode disk 211, the antifriction plate 215, and the cathode holder 213, thereby controlling the temperature of the cathode disk 211. This is because that cathode holder 213 is cooled by cooling water and in turn indirectly cools the cathode disk 211 that is in contact therewith. That is, the temperature of the cathode changes according to the degree of thermal contact between the cathode holder 213 and the cathode disk 211. When the thickness and diameter of the cathode disk 211 are 20 mm and 130 mm, respectively, and plasma power is about 20 kW, the temperature of the cathode may change by about 150° C. to 300° C. by controlling the vacuum absorption force.

During the thermal expansion of the cathode disk 211, the antifriction plate 215 that is used to reduce the frictional force at the contact surface of the cathode disk 211 and the cathode holder 213 is provided with vacuum grooves on both surfaces thereof to form the vacuum absorption force over the entire surface. Alternatively, the antifriction plate 215 may be removed. In this case, the vacuum suction line 217 may be formed to pass through the cathode holder 213 and forms the vacuum absorption force at the contact surface of the cathode disk 211 and the cathode holder 213. However, if the antifriction plate 215 is removed, the frictional force between the cathode holder 213 and the cathode disk 211 increases and then limit free thermal expansion of the cathode disk 211. Accordingly, the antifriction plate 215 is preferably provided.

According to the first or second embodiment of the present invention, the substrate 123 or 223 should be mounted on the anode assembly 120 or 220 that is mounted at the upper portion of the reactor 130 or 230. For this reason, the vacuum suction line 127 or 227 is formed to pass through the anode holder 121 or 221 and the substrate holder 125 or 225, and forms the vacuum absorption force at the contact surface of the substrate holder 125 or 225 and the substrate 123 or 223, and the contact surface of the anode holder 121 or 221 and the substrate holder 125 or 225.

According to a third embodiment of the present invention, the substrate holder 125 or 225 may be mechanically fixed to the anode holder 121 or 221, and the vacuum absorption force may be formed only at the contact surface of the substrate 123 or 223 and the substrate holder 125 or 225 to support the substrate 123 or 223. In this connection, to reduce frictional resistance at the contact surface of the substrate 123 or 223 and the substrate holder 125 or 225, a thin antifriction plate (not shown) formed of graphite is preferably inserted between the substrate 123 or 223 and the substrate holder 125 or 225. In this case, similarly to the second embodiment, the antifriction plate is provided with vacuum grooves on both surfaces thereof to distribute the vacuum absorption force over the entire surface of the antifriction plate.

Here, the width and depth of each of the vacuum grooves needs to be limited to predetermined values or less. If the width of the vacuum groove is too large, the temperature of the silicon substrate rises at contact portions with the vacuum grooves higher than at other portions, which makes it difficult to maintain a uniform temperature.

Figure 4A:
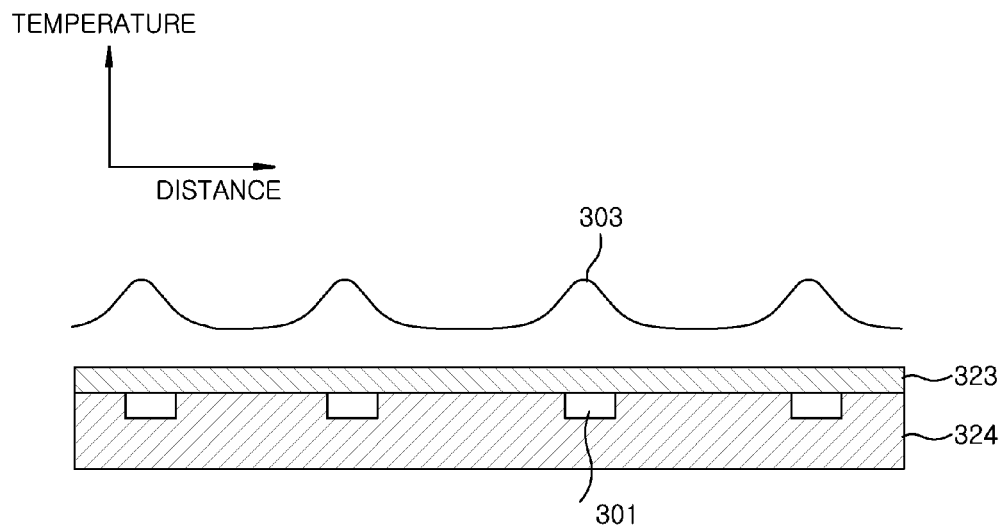
FIGS. 4A and 4B are diagrams showing temperature distribution when an antifriction plate is disposed between a substrate of an anode assembly and a substrate holder, according to a third embodiment of the present invention.
Figure 4B:
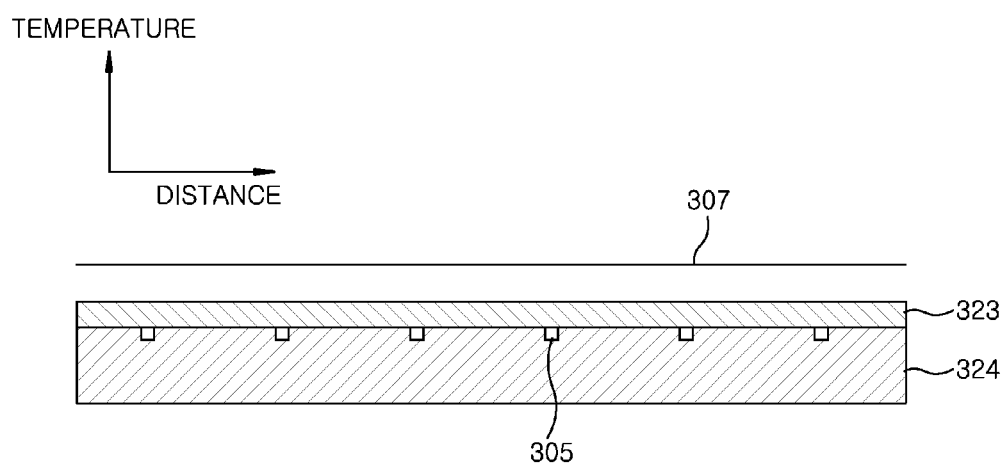

FIGS. 4A and 4B are diagrams showing temperature distribution when an antifriction plate is disposed between a substrate of an anode assembly and a substrate holder, according to a third embodiment of the present invention.

The vacuum absorption force by the vacuum suction line is generally used to lift an object. In this case, it is not necessary to cool the object. Therefore, the vacuum groove can be made sufficiently wide and deep for allowing the vacuum to be well transferred.

Meanwhile, when a temperature needs to be maintained by appropriate cooling in a state where a substrate with low thermal conductivity, such as a semiconductor silicon wafer, is absorbed by a vacuum chuck, as shown in FIG. 4A, if the width of each of vacuum grooves 301 at a contact surface of an antifriction plate 324 and a substrate 323 is designed wide, for example, about 1 mm or more, a region of the substrate 323 that is in contact with the vacuum groove 301 is partially uncooled, and then the temperature in that region rises, which in turn makes a temperature distribution 303 ununiform. As shown in FIG. 4B, if the width of the vacuum groove 305 is designed sufficiently small, that is, if the width of the vacuum groove 305 is less than a predetermined value, a rise in temperature in a region that is in contact with the vacuum groove 305 is negligibly small, thereby achieving a uniform temperature distribution 307. For example, if the width of the vacuum groove 305 is 1 mm or less, and preferably, 0.2 mm to 0.5 mm, the temperature distribution of the substrate is uniform and a sufficient vacuum absorption force is maintained.

Figure 5:
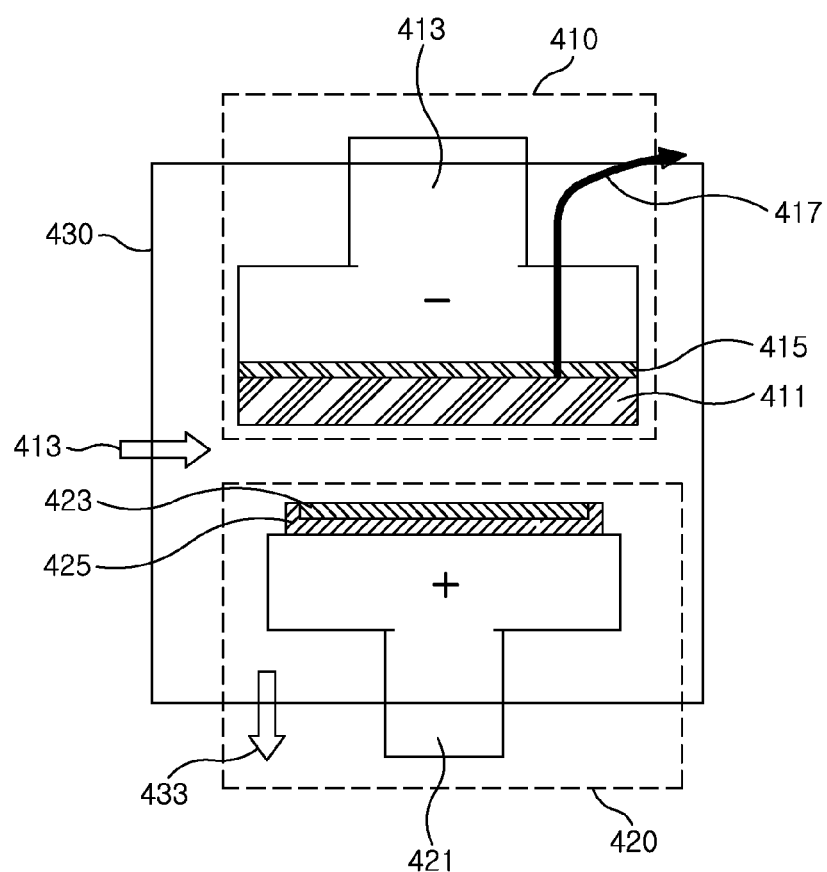
FIG. 5 is a diagram showing the configuration of a DC plasma deposition apparatus according to a fourth embodiment of the present invention.

FIG. 5 is a diagram showing the configuration of a DC plasma deposition apparatus according to a fourth embodiment of the present invention.

The DC plasma deposition apparatus according to the fourth embodiment of the present invention includes a cathode assembly 410 and an anode assembly 420 that are provided to face each other, and a reactor 430 that applies a potential difference between opposing surfaces of the cathode assembly 410 and the anode assembly 420 under a vacuum state to form plasma of a raw gas.

The cathode assembly 410 is mounted at an upper portion of the reactor 430. The cathode assembly 410 includes a cathode disk 411, a water-coolable cathode holder 413 that supports the cathode disk 411, and a thin antifriction plate 415 that is formed of graphite to reduce a frictional force at a contact surface of the cathode disk 411 and the cathode holder 413 during thermal expansion of the cathode disk 411. In addition, the cathode assembly 410 further includes a vacuum suction line 417 that is formed to pass through the cathode holder 413 and the antifriction plate 415, and forms a vacuum absorption force at a contact surface of the cathode disk 411 and the antifriction plate 415, and a contact surface of the antifriction plate 415 and the cathode holder 413.

The anode assembly 420 is mounted at a lower portion of the reactor 430. The anode assembly 420 includes a water-coolable anode holder 421, a substrate 423 that is mounted on the anode holder 421 to serve as an anode, and a substrate holder 425 that mounts and supports the substrate 423. In FIG. 5, reference numeral 431 denotes an inlet port of the reactor 430, and reference numeral 433 denotes an outlet port of the reactor 430.

The fourth embodiment of the present invention is different from the second embodiment of the present invention shown in FIG. 3 in that the cathode assembly 410 and the anode assembly 420 are reversely mounted in comparison to those in the second embodiment. In this case, the substrate 423 can be simply mounted on the substrate holder 425 by its self weight. Accordingly, unlike the second embodiment, a vacuum suction line (reference numeral 227 in FIG. 3) is removed from the anode assembly 420. However, since the vacuum absorption force of the vacuum suction line 417 should support the self weight of the cathode disk 411, the thickness of the cathode disk 411 is preferably made as thin as possible. If the cathode disk 411 is thinned, the surface temperature of the cathode disk 411 decreases under the same cooling condition. For this reason, it is necessary to maintain an appropriate cathode temperature by appropriately controlling thermal contact between the cathode disk 411 and the cathode holder 413.

According to the first to fourth embodiments of the present invention, the factors that cause the arc, such as a crack in the cathode surface, solid carbon in the crack, and electric field concentration at a sharp edge of the crack, are all removed.

Meanwhile, when a silicon substrate is used as the substrate to be mounted on the anode holder, during a heat-up process in which a discharge current, a discharge voltage, and a gas pressure within the reactor are gradually increased after plasma is ignited within the reactor, the surface of the silicon substrate may be slightly damaged. The damaged region that is generated during the heat-up process is in an approximately circle shape, and the diameter thereof is about 1 mm or less. In addition, the degree of damage is slight, and the surface damage depth is merely about several microns.

The arc damage due to the cathode damage or contamination occurs during the deposition process or the heat-up process, and a position where the arc damage occurs is randomly distributed over the substrate surface, while the damages due to other factors constantly occur during the heat-up process and are mainly observed at a central portion of the substrate. These damages occur when the substrate surface is slightly and instantaneously damaged due to concentration of a weak arc or an instantaneous current.

In the present invention, there is suggested a new method that prevents the damage in the central portion of the substrate.

Figure 6A:
FIGS. 6A to 6E are process views showing a method that deposits a thin film on a substrate using a DC plasma deposition apparatus according to the related art.
Figure 6B:
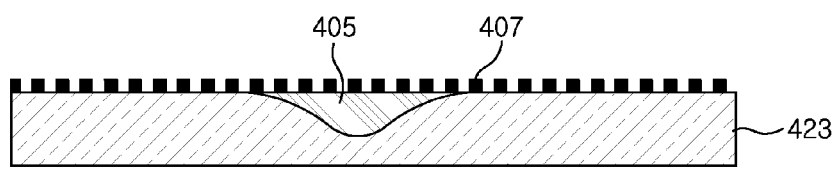
Figure 6C:
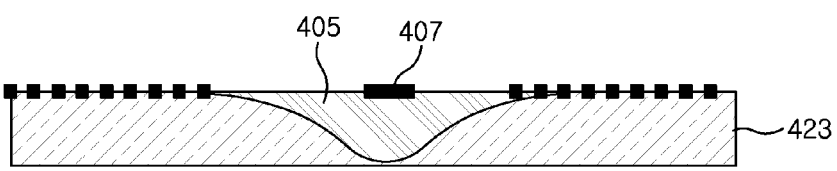
Figure 6D:
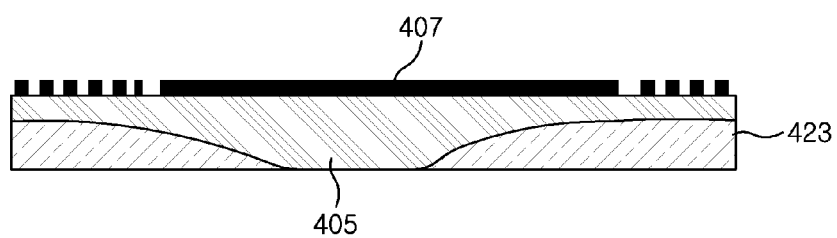
Figure 6E:
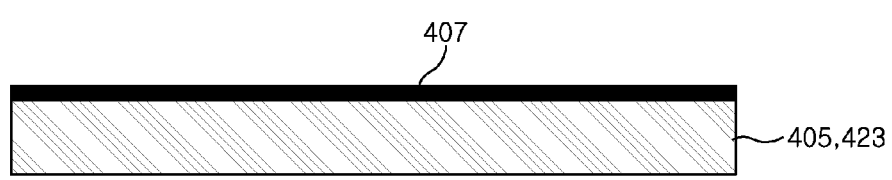
Figure 7:
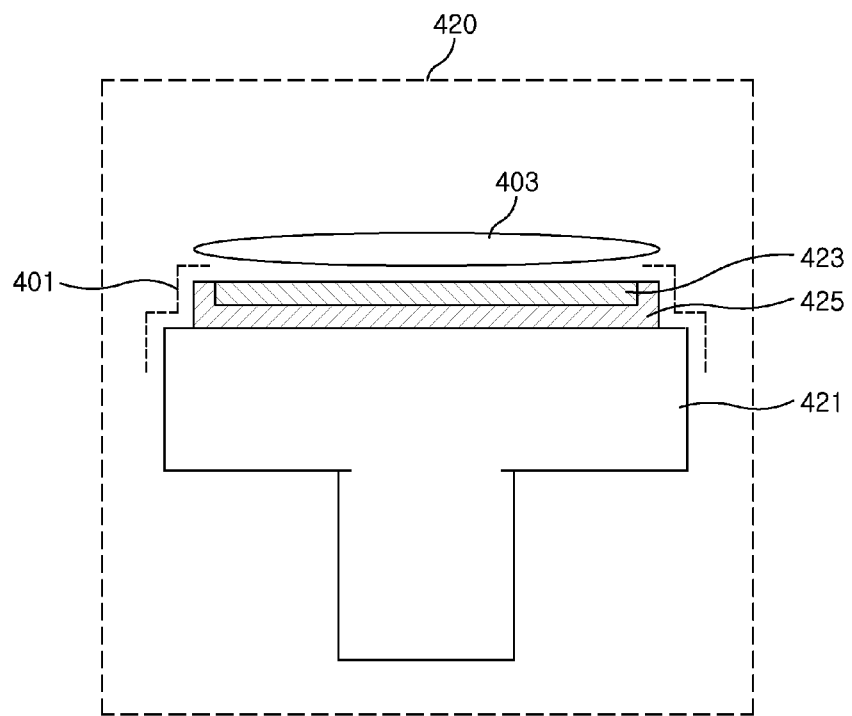
FIG. 7 is a diagram showing the state of plasma and an anode glow, which are formed in an anode assembly.

FIGS. 6A to 6E are process views showing a method of depositing a thin film on a substrate using a DC plasma deposition apparatus according to the related art; and FIG. 7 is a diagram showing the state of plasma and an anode glow, which are formed in an anode assembly.

A semiconductor silicon substrate that is widely used as an NCD thin film or diamond thin film deposition substrate is an insulator at room temperature. Electrical resistance of the silicon substrate decreases as the temperature rises, and at about 600° C. or more, the silicon substrate becomes a conductor. Accordingly, the silicon substrate is kept at 600° C. or more to prevent charge accumulation on the substrate and accordingly occurrence of the arc. Therefore, before the plasma is ignited, the silicon substrate is in the state as shown in FIG. 6A.

Even if the plasma is ignited, since the substrate 423 is an insulator, an anode glows is not formed on the surface of the substrate 423, and as shown in FIG. 7, an anode glow 401 is formed on an exposed portion of the metallic substrate holder 425 or an exposed surface of the anode holder 421. It is known that a thin film is deposited only in a region of the substrate 423 that is covered with the anode glow 401, not in a region that is not covered with the anode glow 401. Electric charges supplied from the plasma move to the ground via the metallic exposed portion in which the anode glow 401 is formed. On the surface of the substrate 423, which is a nonconductor, as shown in FIG. 6B, the charge is only accumulated.

During the heat-up process that gradually increases the gas pressure within the reactor, the discharge voltage, and the discharge current to the final deposition conditions after the plasma is ignited, if the temperature uniformly rises over the entire substrate 423, the entire substrate 423 becomes a conductor at a predetermined temperature. Actually, however, the temperature of the substrate 423 may be partially ununiform. As shown in FIG. 7, while the upper surface of the substrate 423 is heated by the plasma 403, the lower surface thereof is cooled by the water-coolable anode holder 421. Accordingly, the temperature gradient exists between the upper surface and the lower surface of the substrate 423. At this time, the plasma 403 collectively refers to all discharge portions on the opposing surfaces of the cathode disk 411 and the substrate 423, such as a cathode glow, a positive column, and a cathode dark space. The plasma 403 shown in FIG. 7 is not formed in the entire inner space of the reactor but it is partially formed in a space between the cathode and the substrate 423. Then, the substrate 423 is not heated in a region out of the plasma 403, and the substrate 423 and the plasma 403 are incessantly cooled down by a neighboring environment through radiation and conduction. Therefore, if the substrate 423 is uniformly cooled, the temperature of the substrate 423 becomes higher at the central portion than at the edge.

Accordingly, as shown in FIG. 6B, a conductor region 405 first appears in a central portion on the upper surface of the substrate 423. Till then, the anode glow is not formed on the surface of the substrate 423. If the temperature of the substrate further rises, the conductor region 405 is gradually expanded and then coupled to the lower surface of the substrate 423, as shown in FIG. 6C. The electric charges that are accumulated in the conductor region 405 on the upper surface of the substrate 423 till then flow out to the lower surface all at once at the moment that the upper surface and the lower surface of the substrate 423 are connected with each other via the conductor region 405. At this time, an excessive discharge current may be concentrated on the central portion of the substrate 423, and then the surface of the substrate 423 may be damaged. In this regard, as shown in FIG. 6C, an anode glow 407 is first formed in the central portion on the upper surface of the substrate 423, and then a thin film (not shown) starts to be deposited in a region that is covered with the anode glow 407.

If the temperature further rises, as shown in FIGS. 6D and 6E, the anode glow 407 is expanded over the entire upper surface of the substrate 423, and the entire substrate 423 starts to be covered with the thin film (not shown) as a predetermined time elapses. At this time, the conductor region 405 is also expanded, such that the entire substrate 423 becomes a conductor.

Figure 8:
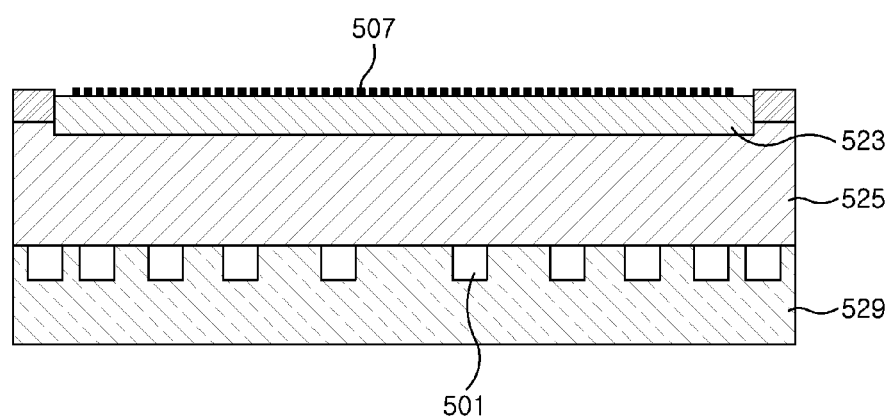
FIG. 8 is a diagram showing the main parts of a DC plasma deposition apparatus according to a fifth embodiment of the present invention.

According to a fifth embodiment of the present invention, to prevent the accumulated charges from being concentrated on the narrow conductor region all at once to become conduction, as shown in FIG. 6C, an additional spacer 529 is provided at a contact surface of a substrate holder 525 and an anode holder (not shown) to control the temperature distribution of the temperature and to increase the temperature of the substrate 523, as shown in FIG. 8.

FIG. 8 is a diagram showing the main parts of a DC plasma deposition apparatus according to a fifth embodiment of the present invention.

Referring to FIG. 8, a spacer 529 is a disk that substantially has the same diameter as the substrate holder 525, and is formed of graphite or a nonferrous metal. Grooves 501 are formed in various shapes including a concentric circle at an upper space of the spacer 529 so as to locally change a thermal contact area of the spacer 529 and the substrate 523.

For example, it is assumed that, when the substrate 523 is uniformly cooled, the temperature of the substrate 523 is higher in its central portion, as shown in FIGS. 6A to 6E. In this case, as shown in FIG. 8, the thermal contact control concentric grooves 501 are distributed more densely at the edge of the spacer 529 than other portions, such that the thermal contact area becomes larger in the central portion of the substrate 523 than in other portions, thereby realizing a uniform substrate temperature. At this time, preferably, the grooves 501 may be concentrically or circular-symmetrically arranged.

Although the spacer 529 may be in direct contact with the substrate 523, the spacer 529 may be in indirect contact with the substrate 523 via the substrate holder 525, as shown in FIG. 8. This is because the temperature of the substrate 523 may be ununiform, as shown in FIG. 4A, when the spacer 529 is in direct contact with the substrate 523.

FIGS. 9A to 9E are process views showing a method of depositing a thin film on a substrate when a spacer is provided at a contact surface of a substrate holder and an anode holder in a DC plasma deposition apparatus, according to a fifth embodiment of the present invention.

Figure 9A:
FIGS. 9A to 9E are process views showing a method that deposits a thin film on a substrate when a spacer is provided at a contact surface of a substrate holder and an anode holder in a DC plasma deposition apparatus, according to a fifth embodiment of the present invention.
Figure 9B:
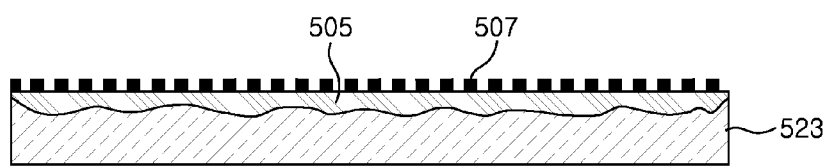
Figure 9C:
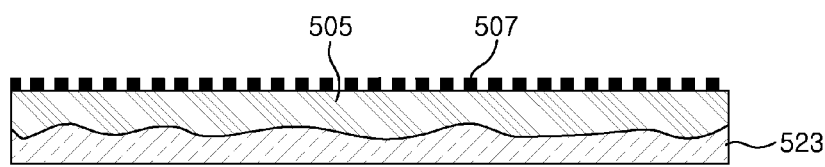
Figure 9D:
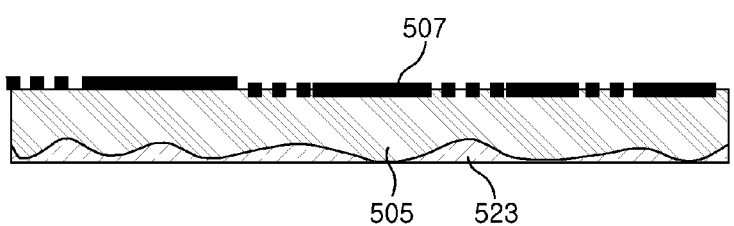
Figure 9E:
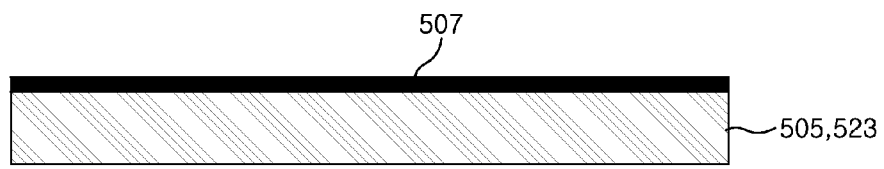

As described above, according to the fifth embodiment of the present invention, the spacer is provided at the contact surface of the substrate holder and the anode holder to control the temperature distribution of the substrate, thereby uniformly increasing the temperature of the substrate 523. In comparison FIGS. 6A to 6E with 9A to 9E, it can be seen that, while the substrate 523 has the same characteristics in a state shown in FIG. 9A before the plasma is ignited, and in a state shown in FIG. 9E after the heat-up process is completed, during the heat-up process, the conductor region 505 is uniformly distributed in the states shown FIGS. 9B, 9C, and 9D than in the states shown in FIGS. 6B, 6C, and 6D, and the anode glow 507 is also uniformly formed. Particularly, as shown in FIG. 9C, since the accumulated charges are not concentrated in the narrow conductor region all at once, the surface of the substrate 523 can be prevented from being damaged due to the excessive discharge current.

Figure 10A:
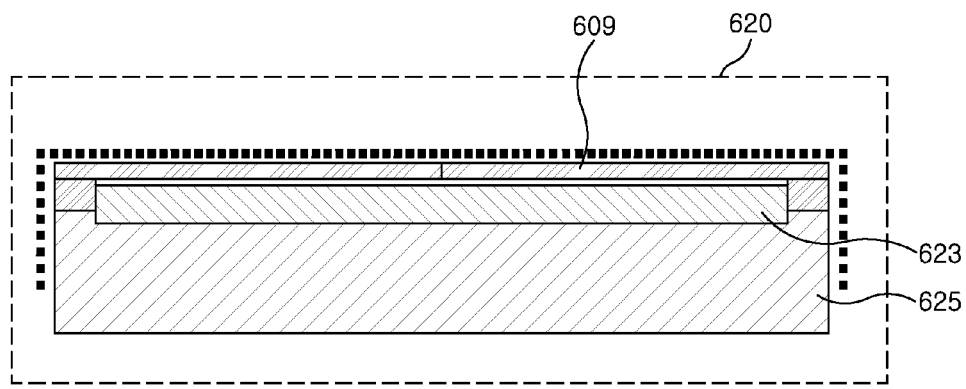
FIGS. 10A to 10C are diagrams showing the main parts of a DC plasma deposition apparatus according to a sixth embodiment of the present invention and a process sequence.
Figure 10B:
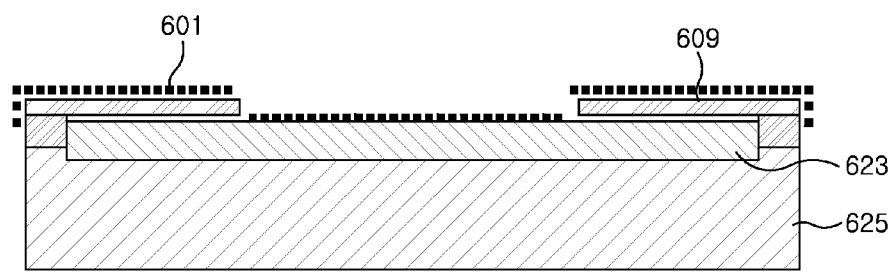
Figure 10C:
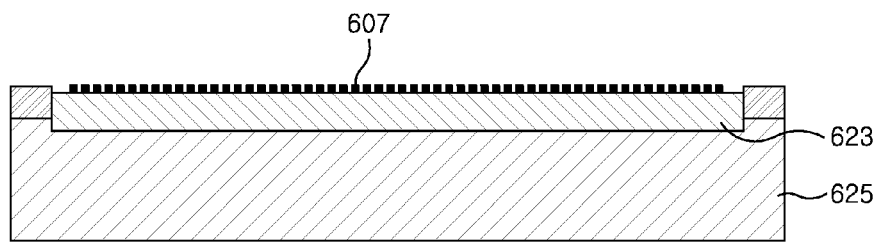

FIGS. 10A to 10C are diagrams showing the main parts of a DC plasma deposition apparatus according to a sixth embodiment of the present invention and a process sequence.

According to the sixth embodiment of the present invention, an externally operable shutter 609 is mounted on a substrate holder 625 of an anode assembly 620. That is, the shutter 609 is mounted on the substrate holder 625, and a substrate 623 is loaded into an inner space below the shutter 609.

During the heat-up process, as shown in FIG. 10A, the shutter 609 is closed to separate the substrate 623 from the plasma, thereby preventing electric charges from being accumulated on the substrate 623. At this time, the substrate holder 625 is heated by the plasma and an anode glow 601, such that the substrate 623 is indirectly and uniformly heated. If the substrate 623 restores conductivity after the heat-up process is completed, as shown in FIGS. 10B and 10C, the shutter 609 is opened again to expose the substrate 623 to the anode glow 601. Then, an anode glow 607 is expanded over the entire surface of the substrate 623. When a predetermined time, for example, ten-odd minutes, elapses after the anode glow 607 is completely expanded, a thin film (not shown) starts to be gradually formed.

Figure 11A:
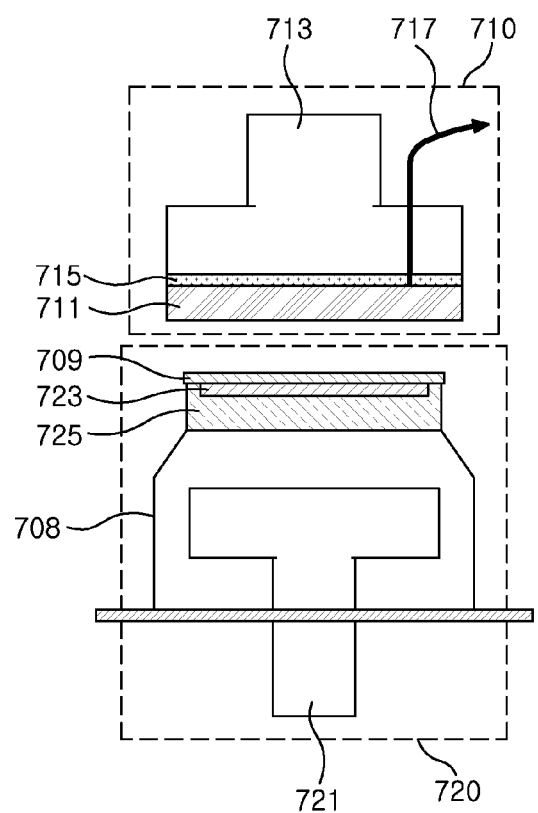
FIGS. 11A to 11C are diagrams showing the configuration of a DC plasma deposition apparatus according to a seventh embodiment of the present invention and a process sequence.
Figure 11B:
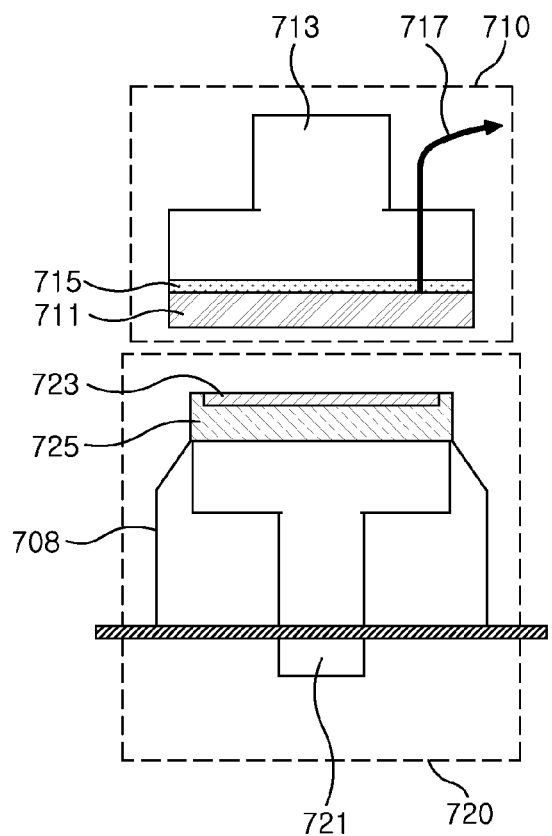
Figure 11C:
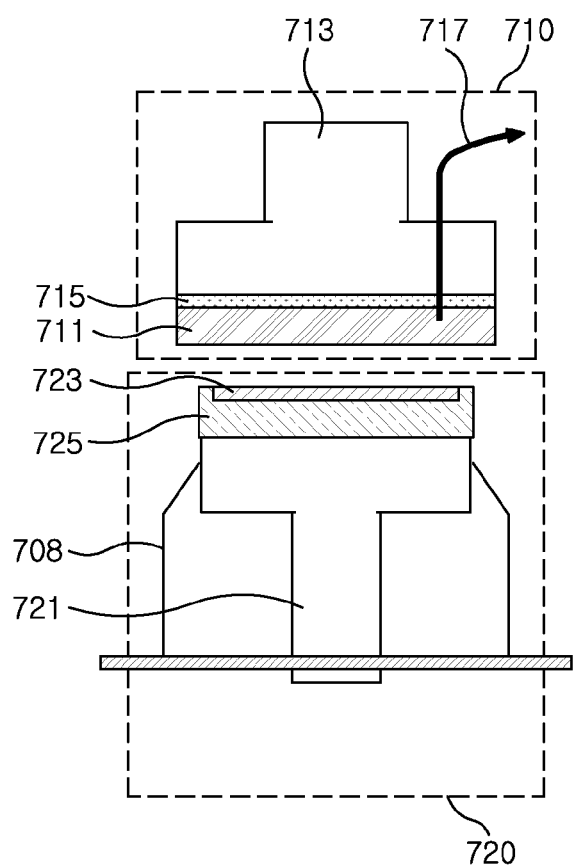

FIGS. 11A to 11C are diagrams showing the configuration of a DC plasma deposition apparatus according to a seventh embodiment of the present invention and a process sequence.

According to a seventh embodiment of the present invention, a DC plasma deposition apparatus includes a cathode assembly 710 and an anode assembly 720 that are provided to face each other, and a reactor (not shown) that applies a potential difference between opposing surfaces of the cathode assembly 710 and the anode assembly 720 under a vacuum state to form plasma of a raw gas.

The cathode assembly 710 is mounted at an upper portion of the reactor. The cathode assembly 710 includes a cathode disk 711, a water-coolable cathode holder 713 that supports the cathode disk 711, a thin antifriction plate 715 that is formed of graphite to reduce a frictional force at a contact surface of the cathode disk 711 and the cathode holder 713 during thermal expansion of the cathode disk 711, and a vacuum suction line 717 that is formed to pass through the cathode holder 713 and the antifriction plate 715, and forms a vacuum absorption force at a contact surface of the cathode disk 711 and the antifriction plate 715, and a contact surface of the antifriction plate 715 and the cathode holder 713.

The anode assembly 720 is mounted at a lower portion of the reactor. The anode assembly 720 includes a substrate holder 725 that has an externally operable shutter 709 mounted thereon, a support 708 that supports the substrate holder 725 separately from an anode holder 721, and the anode holder 721 that moves up and down independently from the support 708. A substrate 723 is mounted on the substrate holder 725. Specifically, the substrate 723 is mounted in an inner space below the shutter 709. The substrate holder 725 is formed of a conductive high melting point metal.

The shutter 709 of the substrate holder 725 is supported to face the cathode disk 711. However, since the substrate holder 725 is simply placed on the support 708 and supported by its self weight, it can be easily separated. The support 708 is electrically grounded.

The support 708 brings the substrate holder 725 into electrical contact with the bottom surface of the reactor by a metal bar, and flows out a current supplied from the plasma to the ground in a state shown in FIG. 1A before the substrate holder 725 comes into contact with the anode holder 721. The support 708 also functions as a heat conduction path that removes a small amount of heat from the substrate holder 725. At this time, an additional spacer (not shown), which corresponds to reference numeral 529 in FIG. 8, is inserted between the support 708 and the substrate holder 725, thereby controlling the temperature distribution of the substrate 723.

According to the seventh embodiment of the present invention, during the heat-up process, the substrate and the substrate holder are increasingly heated. The heat-up process is a process that gradually increase the discharge current, the discharge voltage, and the gas pressure within the reactor to the deposition conditions from the levels much lower than the deposition conditions. The optimum stability of the DC plasma is obtained when the temperature of the anode and cathode is maintained at an optimum temperature, for example, hundreds ° C. During the heat-up process, the temperature of the electrode gradually rises from the room temperature to the optimum temperature, and thus the heat-up process is as short as possible.

Referring to FIG. 11A, during the heat-up process, in a state where the substrate 723 is mounted on the substrate holder 725 and the shutter 709 is closed, a voltage is applied between the cathode disk 711 and the shutter 709 under the vacuum state of the reactor to start discharge.

Subsequently, while the discharge voltage, the discharge current, and the gas pressure within the reactor are gradually increased, the substrate holder 725 is exposed to the plasma and then heated. At this time, the substrate 723 that is mounted in the substrate holder 725 is directly heated by the substrate holder 725. Here, the substrate holder 725 is supported by the support 708 separately from the anode holder 721, and the anode holder 721 is water-cooled. During the heat-up process, since the substrate holder 725 and the anode holder 721 are separated from each other, a heat loss of the substrate holder 725 and the substrate 723 is minimized, thereby maximizing a temperature rising speed.

For example, when the substrate holder 725 is in contact with the anode holder 721, according to the related art, it takes a lot of time, for example, 20 minutes, until the temperature of the substrate rises to 750° C. At this time, the required discharge voltage and discharge current are 400 volts and 45 amperes, respectively. In contrast, according to the seventh embodiment of the present invention, on the same conditions, the time until the substrate reaches the same temperature is reduced to about less than 5 minutes. In addition, the discharge current is only about 20 amperes or less.

Referring to FIGS. 11B and 11C, if the heating of the substrate 723 is completed and the deposition starts, the substrate holder 725 and the anode holder 721 are brought into contact with each other again to indirectly cool the substrate 723, thereby maintain an appropriate deposition temperature. At this time, in a state shown in FIG. 11A, the substrate holder 725 is simply placed on the support 708 by its self weight, and then is easily separated from the support 708 when the anode holder 721 lifts up the substrate holder 725, as shown in FIGS. 11B and 11C.

In the known microwave plasma CVD method, an additional heater is provided in the anode holder to control the temperature of the substrate. In this case, however, the heater may absorb the microwaves, and then overheated and destroyed. In addition, the structure becomes complicated to mount the heater, and thus maintenance and repair are hard to be performed. Furthermore, since the heater is inserted between the anode holder and the substrate holder, on a high-power deposition condition on which high heating is performed by the plasma, the heater may disturb cooling, and then overheating may occur. According to the seventh embodiment of the present invention, the temperature of the substrate can be simply controlled without causing the above-described problems, and the conductivity of the substrate can be prevented from being damaged.

As such, while the substrate 723 rapidly restores the conductivity by indirect heating, the charge accumulation is blocked since the substrate 723 is separated from the plasma by the shutter 709. Therefore, the substrate 723 can be prevented from being damaged when the conduction path is formed. In addition, if the heating sufficiently progresses, and the discharge current and the discharge voltage reach sufficient high values, the substrate 723 that is indirectly heated by the sufficiently heated substrate holder 725 reaches a sufficient temperature. After the semiconductor substrate 723 restores the conductivity, as shown in FIGS. 10B and 10C, the shutter 709 is gradually opened to gradually expose the upper surface of the substrate 723 to the plasma. Then, an anode glow is formed on the upper surface of the substrate 723, and accordingly a thin film starts to be deposited on the substrate 723.

Here, the shutter 709 of the substrate holder 725 may have various shapes, for example, a wing shape and an iris shape, according to an opening/closing mechanism, and may be opened/closed by an external operation. The wing-shaped shutter is designed such that, when it is opened by an external operation, a distance between the shutter 709 and the cathode disk 711 is longer than a distance between the substrate 723 and the cathode. If not so, the plasma may be continuously formed between the cathode and the shutter 709, as well as between the substrate 723 and the cathode, which causes unnecessary power consumption. For this reason, a thin film is not well deposited on the substrate 723. The iris-shaped shutter has a similar structure to an iris shutter of a camera. When it is opened, the wings of the shutter are opened toward the outer diameter of the shutter and housed at the edge portions. Accordingly, an anode glow smoothly moves from the surface of the shutter 709 to the surface of the substrate 723, as compared with the wing-shaped shutter. Meanwhile, the substrate holder 725 and the shutter 709 are preferably formed of a high melting point metal.

While the present invention has been shown and described with respect to the preferred embodiments, it will be understood by those skilled in the art that various changes and modification may be made without departing from the scope of the present invention as defined in the following claims.

What is claimed is:

1. A plasma deposition apparatus, comprising:
    a cathode assembly including
        a cathode disk,
        a water-coolable cathode holder supporting the cathode disk,
        a cathode vacuum suction line that extends downwardly from a contact surface of the cathode disk and a graphite antifriction plate to the outside of a reactor, and
        the graphite antifriction plate that is disposed between the cathode holder and the cathode disk, and reduces a frictional force at the contact surface of the cathode disk and the cathode holder during thermal expansion of the cathode disk;
    an anode assembly including
        a water-coolable anode holder,
        a spacer on the anode holder having grooves formed at an upper surface of the spacer in which the grooves are more densely formed at edges of the spacer than in a middle portion of the spacer,
        a substrate holder mounted on the anode holder and on the spacer,
        a substrate mounted on the anode holder by being nested within the substrate holder to serve as an anode,
        an anode vacuum suction line that extends upwardly from the contact surface of the substrate and the substrate holder to the outside of a reactor, and
        an antifriction plate inserted between the substrate and the substrate holder, wherein the antifriction plate is provided with vacuum grooves on both surfaces; and
    the reactor for applying a potential difference between opposing surfaces of the cathode assembly and the anode assembly under a vacuum state to form plasma of a raw gas, wherein the cathode disk comes into thermal contact with the cathode holder using at least one of a self weight and a vacuum absorption force so as to permit thermal expansion of the cathode disk.

2. The plasma deposition apparatus of claim 1, wherein the cathode assembly is mounted at a lower portion of the reactor, the anode assembly is mounted at an upper portion of the reactor, and the cathode disk comes into thermal contact with the cathode holder using the self weight.

3. The plasma deposition apparatus of claim 1, wherein the cathode assembly includes the cathode vacuum suction line that passes through the cathode holder and forms the vacuum absorption force at a contact surface of the cathode disk and the cathode holder, and
    wherein the cathode assembly is mounted at a lower portion of the reactor, the anode assembly is mounted at an upper portion of the reactor, and the cathode disk comes into thermal contact with the cathode holder using the self weight and the vacuum absorption force.

4. The plasma deposition apparatus of claim 1, wherein the cathode assembly includes the cathode vacuum suction line that passes through the cathode holder and forms the vacuum absorption force at a contact surface of the cathode disk and the cathode holder, and
    wherein the cathode assembly is mounted at an upper portion of the reactor, the anode assembly is mounted at a lower portion of the reactor, and the cathode disk comes into thermal contact with the cathode holder using the vacuum absorption force.

5. The plasma deposition apparatus of claim 3 or 4, wherein the cathode vacuum suction line passes through the cathode holder and the graphite antifriction plate, and forms the vacuum absorption force at a contact surface of the cathode disk and the graphite antifriction plate and a contact surface of the graphite antifriction plate and the cathode holder.

6. The plasma deposition apparatus of claim 5, wherein a degree of vacuum in the cathode vacuum suction line is controlled to adjust the vacuum absorption force between the cathode disk, and the graphite antifriction plate and the cathode holder, thereby controlling a temperature of the cathode disk according to a degree of thermal contact between the cathode holder and the cathode disk.

7. The plasma deposition apparatus of claim 5, wherein the graphite antifriction plate includes vacuum grooves formed thereon to distribute the vacuum absorption force over the entire surface thereof.

8. The plasma deposition apparatus of claim 7, wherein the width of each of the vacuum grooves is in a range of about 0.2 mm to 0.5 mm.

9. The plasma deposition apparatus of claim 2 or 3, wherein the anode assembly includes the anode vacuum suction line that passes through the anode holder and the substrate holder, and forms the vacuum absorption force at a contact surface of the substrate holder and the substrate, and a contact surface of the anode holder and the substrate holder.

10. The plasma deposition apparatus of claim 2 or 3, wherein the anode assembly includes the anode vacuum suction line that passes through the anode holder and the substrate holder, and forms the vacuum absorption force at a contact surface of the substrate holder and the substrate, and wherein the substrate holder is mechanically fixed to the anode holder.

11. The plasma deposition apparatus of claim 1, wherein the vacuum grooves of the antifriction plate formed thereon distribute the vacuum absorption force over the entire surface thereof.

12. The plasma deposition apparatus of claim 11, wherein the width of each of the vacuum grooves is about 0.2 mm to 0.5 mm.

13. The plasma deposition apparatus of claim 1, wherein grooves of the spacer formed at the upper surface of the spacer locally change a thermal contact area of the spacer and the substrate.

14. The plasma deposition apparatus of claim 1, wherein the grooves of the spacer are circular-symmetrically arranged.

15. The plasma deposition apparatus of claim 4, wherein the anode assembly includes an externally operable shutter mounted on the substrate holder, the substrate being mounted in an inner space below the shutter.

16. A plasma deposition apparatus, comprising:
 a cathode assembly wherein the cathode assembly includes
  a cathode disk,
  a cathode holder supporting the cathode disk such that the cathode holder does not suppress but freely allows thermal expansion of the cathode disk which is fixed to the cathode-holder,
  a graphite antifriction plate that is disposed between the cathode holder and the cathode disk, and the graphite antifriction plate reduces a frictional force at the contact surface of the cathode disk and the cathode holder during the thermal expansion of the cathode disk, and
  a cathode vacuum suction line that extends downwardly from a contact surface of the cathode disk and a graphite antifriction plate to the outside of a reactor;
 an anode assembly; and
 the reactor,
 wherein the anode assembly includes:
  a substrate holder that has an externally operable shutter mounted thereon,
  a substrate nested within the substrate holder being mounted in an inner space below the shutter,
  an antifriction plate inserted between the substrate and the substrate holder, wherein the antifriction plate is provided with vacuum grooves on both surfaces;
  a support that separably supports the substrate holder by a self weight and is electrically grounded;
  an anode holder that moves up and down independently from the support and comes into thermal contact with the substrate holder when moving up
  an anode vacuum suction line that extends upwardly from the contact surface of the substrate and the substrate holder to the outside of the reactor; and
  a spacer between the support and the substrate holder having grooves formed at an upper surface of the spacer in which the grooves are more densely formed at edges of the spacer than in a middle portion of the spacer.

17. The plasma deposition apparatus of claim 16, wherein the support brings the substrate holder into electrical contact with the reactor.

18. The plasma deposition apparatus of claim 16, wherein the cathode assembly further includes the cathode vacuum suction line passing through the cathode holder and forming a vacuum absorption force at a contact surface of the cathode disk and the cathode holder, and
 wherein the cathode assembly is mounted at an upper portion of the reactor, the anode assembly is mounted at a lower portion of the reactor, and the cathode disk comes into thermal contact with the cathode holder using the vacuum absorption force.

19. The plasma deposition apparatus of claim 18, wherein the antifriction plate is disposed between the cathode holder and the cathode disk and reduces a frictional force at the contact surface of the cathode disk and the cathode holder during thermal expansion of the cathode disk, and
 wherein the cathode vacuum suction line passes through the cathode holder and the graphite antifriction plate, and forms the vacuum absorption force at a contact surface of the cathode disk and the graphite antifriction plate, and a contact surface of the graphite antifriction plate and the cathode holder.

20. A plasma deposition apparatus, comprising:
 a cathode assembly comprising:
  a cathode disk;
  a cathode holder fixed to the cathode disk, wherein the cathode holder having internal screw holes;
  a graphite antifriction plate that is disposed between the cathode holder and the cathode disk, wherein the graphite antifriction plate reduces a frictional force at the contact surface of the cathode disk and the cathode holder during the thermal expansion of the cathode disk; and
  a cathode vacuum suction line that extends downwardly from a contact surface of the cathode disk and a graphite antifriction plate to the outside of a reactor;
 an anode assembly comprising:
  a substrate holder that has an externally operable shutter mounted thereon, wherein the shutter is designed as a wing-shaped shutter or an iris-shaped shutter;
  a substrate nested within the substrate holder being mounted in an inner space below the shutter;
  an antifriction plate inserted between the substrate and the substrate holder, wherein the antifriction plate is provided with vacuum grooves on both surfaces;
  an anode vacuum suction line that extends upwardly from the contact surface of the substrate and the substrate holder to the outside of the reactor;
  a support that separably supports the substrate holder by a self weight and is electrically grounded, wherein the support brings the substrate holder into electrical contact with the reactor;
  an anode holder that moves up and down independently from the support and comes into thermal contact with the substrate holder when moving up; and
  a spacer between the support and the substrate holder having grooves formed at an upper surface of the spacer in which the grooves are more densely formed at edges of the spacer than in a middle portion of the spacer; and
 the reactor containing the cathode assembly and the anode assembly, wherein the reactor comprising an inlet port and an outlet port.

\* \* \* \* \*